United States Patent [19]

Kawamoto et al.

[11] Patent Number: 5,252,428
[45] Date of Patent: Oct. 12, 1993

[54] PHOTORESIN RELIEF PRINTING PLATE

[75] Inventors: Tadashi Kawamoto; Yuji Aoki, both of Fuji, Japan

[73] Assignee: Asahi Kasei Kogyo Kabushiki Kaisha, Osaka, Japan

[21] Appl. No.: 873,653

[22] Filed: Apr. 23, 1992

Related U.S. Application Data

[63] Continuation of Ser. No. 727,360, Jul. 9, 1991, abandoned, which is a continuation of Ser. No. 331,400, Mar. 31, 1989, abandoned.

[30] Foreign Application Priority Data

Mar. 31, 1988 [JP] Japan ................................ 63-75928

[51] Int. Cl.$^5$ ............................................. G03C 1/492
[52] U.S. Cl. ................................. 430/271; 430/273; 430/306; 430/502; 101/395; 101/401; 101/401.1
[58] Field of Search ............... 430/271, 273, 306, 502, 430/15, 18; 101/395, 401, 401.1

[56] References Cited

U.S. PATENT DOCUMENTS

| | | |
|---|---|---|
| 3,663,222 | 5/1972 | Akamatsu et al. |
| 3,832,177 | 8/1974 | Akamatsu et al. |
| 3,864,133 | 2/1975 | Hisamatsu et al. |
| 3,912,516 | 10/1975 | Recchia et al. |
| 3,948,665 | 4/1976 | Richter et al. |
| 3,960,572 | 6/1976 | Ibata et al. |
| 4,192,684 | 3/1989 | Gensho et al. |
| 4,264,705 | 4/1981 | Allen ................................ 430/271 |

FOREIGN PATENT DOCUMENTS

| | | |
|---|---|---|
| 3516614 | 9/1957 | Japan. |
| 371306 | 1/1959 | Japan. |
| 74018721 | 11/1973 | Japan. |
| 49-102405 | 9/1974 | Japan. |
| 50-006934 | 3/1975 | Japan. |
| 51-043374 | 1/1976 | Japan. |
| 57090304 | 7/1977 | Japan. |
| 71029525 | 7/1977 | Japan. |
| 50063031 | 5/1979 | Japan. |
| 54-092402 | 7/1979 | Japan. |
| 1312492 | 4/1973 | United Kingdom. |
| 1366769 | 11/1974 | United Kingdom. |
| 1454191 | 10/1976 | United Kingdom. |
| 2012977 | 5/1982 | United Kingdom. |

OTHER PUBLICATIONS

Partial translation of Japanese Patent Application Laid–Open Specification No. 62-124559.

*Primary Examiner*—Jack P. Brammer
*Attorney, Agent, or Firm*—Birch, Stewart, Kolasch & Birch

[57] ABSTRACT

A photoresin relief printing plate comprising a support and a photoresin relief portion disposed thereon, said relief portion having a thickness of not greater than 8 mm and comprising an upper photoresin layer and a lower photoresin layer, wherein said upper photoresin layer has a thickness of at least 2 $\mu$m and a Young's modulus of not greater than 650 kg/cm$^2$ and said lower photoresin layer has a thickness which is greater than the Young's modulus of said upper photoresin layer and a thickness which is greater than the Young's modulus of said upper photoresin layer. The photoresin relief printing plate exhibits not only excellent inking and ink transferability even in solid images, but also excellently less broadening of printed images and excellent image reproducibility, even if the printing operation is performed using an ordinary relief printing machine having poor machine accuracy.

10 Claims, 1 Drawing Sheet

PHOTORESIN RELIEF PRINTING PLATE

This application is a continuation of application Ser. No. 07/727,360 filed on Jul. 9, 1991, which is a continuation of Ser. No. 07/331,400, filed on Mar. 31, 1989, both now abandoned.

BACKGROUND OF THE INVENTION

1. Field of the Invention

The present invention relates to a novel photoresin relief printing plate. More particularly, the present invention is concerned with a photoresin relief printing plate comprising a support and a relief portion formed thereon, which relief portion has a multilayer structure comprised of a soft upper layer and a hard lower layer, thereby providing the printing plate with not only excellent ink transferability of printing images having large solid areas, but also excellent image reproducibility.

2. Discussion of Related Art

Photoresin relief printing plates are generally produced by laminating, in the following order, one or more photosensitive resin layers and an image-bearing transparency on a support made of a synthetic resin, metal or paper which has an adhesive and an anti-halation layer thereon; irradiating the resultant laminate with active rays from the side of the image-bearing transparency to photocure selected areas of the photosensitive resin layer; and removing the unexposed, uncured areas of the irradiated laminate to form a relief layer.

On the other hand, an offset printing system is known to exhibit excellent printing performances, but is disadvantageously complicated in operation. Therefore, in the field of a relief printing system which is simple in operation, there is an increasing demand for developing a printing plate which not only has excellent printing resistance but also exhibits excellent printing performances, such as high resolution, excellent ink transferability and uniformity in printing images having a larger solid area and excellent tone reproducibility.

In relief printing, generally, the ink transferability and image resolution of a printing plate depend on the hardness of the printing plate. Illustratively stated, a relief printing plate having a high hardness is excellent in resolution but poor in ink transferability, whereas a relief printing plate having a low hardness is excellent in ink receptivity and ink transferability and therefore can provide a uniform print without dimness in printed images having a large solid area, but is susceptible to printing pressure and is likely to cause printed images to be broadened, rendering it difficult to attain high resolution.

In order to cope with the above-mentioned problems that are associated with conventional relief printing, an attempt was made to modify the photopolymerization characteristics of a photosensitive resin composition so as to improve the image resolution of the ultimate relief printing plate and the sharpness of the top edge portions of reliefs of the ultimate relief printing plate for rendering sharp the printed images (see Japanese Patent Application Publication Nos. 35-16614 and 37-1306). However, with respect to the relief printing plate of the above-mentioned type, when the hardness of the printing plate is high, a high printing pressure is needed to realize high ink transferability free from dimness in printed images having a large solid area. Therefore, although the printing plate has a high resolution, a marginal zone increase in the half-tone areas cannot be avoided due to the high printing pressure applied and consequently the quality of the obtained impressions is likely to be poor. Herein, the term "marginal zone" is intended to mean an unwanted printing area formed due to the ink protruding outwardly from the upper surface areas of the relief when the relief is pressed against a substrate to be printed. On the other hand, when the hardness of the printing plate is low, high ink transferability can be attained, but the broadening of the printed images, particularly at their small areas, disadvantageously becomes large. Therefore, the relief printing plate of this type is incapable of producing high grade impressions, such as those which are obtainable by offset printing.

Further, another type of photoresin relief printing plate was proposed, which has a relief comprising a surface layer and a base layer having a hardness which is smaller than that of the surface layer. This printing plate was devised for the purpose of decreasing the difference between the printing pressure exerted in the relief portions having small surface areas and the pressure exerted at the relief portions having large surface areas of the printing plate. The difference in printing pressure causes printed images at their small areas to be broadened disadvantageously. This proposed printing plate is effective for reducing such a pressure difference because the high printing pressure exerted at the small-area upper surfaces of relief portion is effectively absorbed by the soft base layer due to its cushioning action (see Japanese Patent Application Publication No. 61-56506). With this proposed photoresin relief printing plate having hard relief surface layers, however, when such a high ink transferability as can be attained by offset printing technique is intended to be obtained with respect to images having a large solid area by the use of a printing plate of this type, but of a wholly relatively hard type, it is necessary to apply a printing pressure higher than that for printing, by means of a printing plate having a single-layer relief having the same hardness throughout the entire thickness as that of the surface layer of this proposed printing plate, due to the cushioning action of the base layer. Therefore, in such a case, even if the broadening of printed lines constituting each half-tone image can be suppressed to some extent, it is impossible to attain a high ink transferability with respect to images having a large solid area and a high resolution which are both comparable to those as attained by offset printing technique. On the other hand, when a printing plate of this type, but of a wholly relatively soft type is used, a satisfactory ink transferability can be attained with respect to images having a large solid area, but the broadening of printed lines constituting each half-tone image becomes inevitably large so that a high resolution of images cannot be attained when a printing machine having poor machine accuracy is used or when printing is conducted on a substrate having poor surface smoothness.

Conventionally, ink transferability (and hence the quality of printed solid images) has been assessed by the determination of the reflection density (which is expressed by the common logarithm of the ratio of the luminance of a non-absorbing perfect diffuser to that of the surface under consideration, when both are illuminated at an angle of 45° to the normal and the direction of measurement is perpendicular to the surface) of images. However, the present inventors have found that the quality of solid images is greatly affected by the visual coarseness of the images, which visual coarseness is derived from tiny vacant areas in the images, and hence ink transferability cannot be assessed simply by the determination of the reflection density and should also be assessed by the determination of the total area of the vacant areas in the images.

In these situations, the present inventors have devised a method for the quantitative evaluation of ink transferability by the determination of the ratio of the vacant areas in solid images (hereinafter often referred to simply as "vacant area ratio"). In this method, the vacant area ratio (%) is measured by using a half tone dots analyzer and is expressed in terms of the percentage of the total area of the vacant areas in the image at a predetermined given level of reflection density (this level is called "reflection density slice level"). For example, with respect to a solid image printed on a newspaper by offset printing, the vacant area ratio is 2% or less for high grade printing and even low grade printing exhibits a vacant area ratio of at most 5%, at a reflection density slice level of 0.5 D when the reflection density of a portion uniformly coated with the ink is taken as 1 D. In contrast, with respect to a solid image printed on a newspaper by relief printing using conventional printing plates, the vacant area ratio is 5% or so even for high grade printing and low grade printing exhibits a vacant area ratio as high as about 15%. The vacant area ratio of images produced by conventional relief printing techniques is generally 5 to 10%. That is, it is apparent that relief printing using conventional relief printing plates is largely inferior to offset printing with respect to ink transferability.

Thus, the vacant area ratio is a yardstick for properly assessing ink transferability.

In relief printing, a low printing pressure and a small amount of ink are usually employed in order to prevent a broadening of printed fine lines. Therefore, the vacant area ratio of a solid image printed by relief printing is likely to be disadvantageously high. In contrast, impressions obtained by offset printing generally has excellent ink transferability, that is, it exhibits a vacant area ratio as low as 5% or less, preferably 3% or less. In the field of relief printing also, it has been desired to develop a relief printing plate exhibiting a vacant area ratio of the level attained by offset printing.

On the other hand, with respect to the broadening of printed lines, in the field of printing which requires high precision, such as newspaper printing, excellent sharpness of impressions can be obtained when the broadening in line width as from a relief line having a width of 60 $\mu$m to a printed line is generally 60 $\mu$m or less. In the field of printing which does not require so high a precision, such as corrugated board printing, good sharpness of impressions can be obtained when the broadening in line width as from a relief line having a width of 300 $\mu$m to a printed line is generally 200 $\mu$m or less.

However, with respect to the conventional relief printing plates, when the vacant area ratio in printed solid images is reduced, the broadening of printed lines inevitably becomes large, and vice versa. There is a serious technical dilemma to be solved.

SUMMARY OF THE INVENTION

The present inventors have made extensive and intensive studies with a view toward developing a relief printing plate exhibiting not only a vacant area ratio as low as the level attained by offset printing, but also a reduced degree of broadening in line width as from a relief line to a printed line. As a result, it has been found that a photoresin relief printing plate comprising a support and provided thereon a multilayer photoresin relief comprising a relatively soft upper photoresin layer and a relatively hard lower photoresin layer, wherein the lower photoresin layer has a thickness which is greater than that of the upper photoresin layer, can attain both excellent ink transferability (low vacant area ratio) with respect to images having a large solid area and high image reproducibility. Based on this finding, the present invention has been completed.

Accordingly, it is an object of the present invention to provide a photoresin relief printing plate which is excellent in both ink transferability with respect to images having a large solid area and image reproducibility, attaining excellent printing characteristics, namely, low vacant area ratio and freedom from the disadvantageous broadening of printed lines.

The foregoing and other objects, features and advantages of the present invention will be apparent to those skilled in the art from the following description and appended claims, taken in connection with the accompanying drawing.

BRIEF DESCRIPTION OF THE DRAWING

In the drawing:

In FIGS. 1 through 3, like parts or portions are designated by like numerals.

DETAILED DESCRIPTION OF THE INVENTION

According to the present invention, there is provided a photoresin relief printing plate comprising:

a support and a photoresin relief portion disposed thereon, said relief portion having a thickness of not greater than 8 mm and comprising an upper photoresin layer and a lower photoresin layer, said upper and lower photoresin layers being provided, on said support in the order from said support, of said lower photoresin layer and said upper photoresin layer, said upper photoresin layer having a thickness of at least 2 $\mu$m and a Young's modulus of not greater than 650 kg/cm$^2$, said lower photoresin layer having a thickness which is greater than the thickness of said upper photoresin layer and being composed of a single layer or two different layers, wherein said single layer of said lower photoresin layer has a Young's modulus which is greater than the Young's modulus of said upper photoresin layer, and said two different layers of said lower photoresin layer has an average Young's modulus which is greater than the Young's modulus of said upper photoresin layer.

In the photoresin relief printing plate of the present invention, the photoresin relief is required to have a thickness of 8 mm or less. If the thickness of the photoresin relief is larger than 8 mm, not only does the photoresin relief not exhibit a satisfactory resolution, but also the cost of the relief disadvantageously becomes high because of the expensiveness of the photosensitive resin material.

In the present invention, the photoresin relief of the photoresin relief printing plate comprises a relatively soft upper photoresin layer and a relatively hard lower photoresin layer. The upper and lower photoresin layers are provided, on the support in the order from the support, of the lower photoresin layer and the upper photoresin layer.

The relatively soft upper photoresin layer (hereinafter often referred to simply as "soft upper layer") is required to have a thickness of at least 2 µm and a Young's modulus of not greater than 650 kg/cm², preferably not greater than 300 mg/cm². If the thickness of the upper photoresin layer is less than 2 µm or the Young's modulus of the upper photoresin layer is larger than 650 kg/cm², a good ink adhesion to the relief cannot be attained, leading to a lowering of ink transferability with respect to solid images.

On the other hand, the relatively hard lower photoresin layer (hereinafter often referred to simply as "hard lower layer") is required to have a thickness which is greater than the thickness of the upper photoresin layer.

The hard lower layer may be composed of a single layer or two different layers, namely, a first hard layer and a second hard layer. In the case of the hard lower layer composed of a single layer, the hard lower photoresin layer has a Young's modulus which is greater than the Young's modulus of the soft upper layer, whereas in the case of the hard lower layer composed of two different layers, the hard lower layer has an average Young's modulus which is greater than the Young's modulus of the soft upper layer. The term "average Young's modulus" used herein is intended to mean the value ($\overline{M}$) represented by the following formula:

$$\overline{M}(kg/cm^2) = \frac{M_1 \times T_1 + M_2 \times T_2}{T_1 + T_2}$$

wherein $M_1$ and $M_2$ are respectively the Young's moduli (kg/cm²) of the first and second hard layers, and $T_1$ and $T_2$ are respectively the thicknesses (mm) of the first and second hard layers.

If the hard lower photoresin layer has a Young's modulus of not greater than the Young's modulus of the upper photoresin layer, the hardness of the relief is not sufficient and the broadening of the printed lines constituting images becomes large, causing it to be impossible to obtain sharp impressions.

Figure 1:
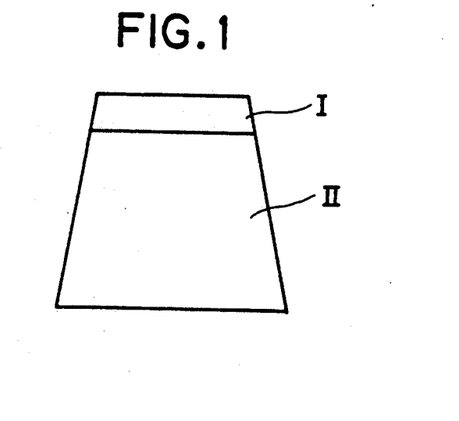
FIG. 1 shows a schematic side view of the relief portion of the first embodiment of photoresin relief printing plate according to the present invention.

Referring now to FIG. 1 in which a schematic side view of the relief portion of a first embodiment of photoresin relief printing plate according to the present invention is shown, the photoresin relief portion comprises upper photoresin layer I and lower photoresin layer II. The photoresin relief portion is disposed on a support (not shown). Lower photoresin layer II is composed of a single layer. Upper photoresin layer I is required to have a thickness of at least 2 µm and a Young's modulus of not greater than 650kg/cm², preferably not greater than 300 kg/cm². If the thickness of upper photoresin layer I is less than 2 µm or the Young's modulus of upper photoresin layer I is larger than 650 kg/cm², a good ink adhesion to the relief cannot be attained, leading to a lowering of ink transferability with respect to solid images. The total thickness of upper and lower photoresin layers I and II is not greater than 8 mm. Lower photoresin layer II preferably has a thickness of at least 4 times, more preferably 8 times that of upper photoresin layer I and a Young's modulus of at least 2 times that of upper photoresin layer I. Further, when the thickness of the relief is 4 mm or more, lower photoresin layer II more preferably has a thickness of at least 10 times that of upper photoresin layer I.

In the first embodiment of the present invention, the relationships in thickness and Young's modulus between layer I and layer II can be schematically represented as follows:

| Thickness |
|---|
| I + II ≦ 8 mm |
| I ≧ 2 µm |
| II ≧ 4 × I, preferably II ≧ 8 × I |
| Young's modulus |
| I ≦ 650 kg/cm², preferably I ≦ 300 kg/cm² |
| II ≧ 2 × I |

Figure 2:
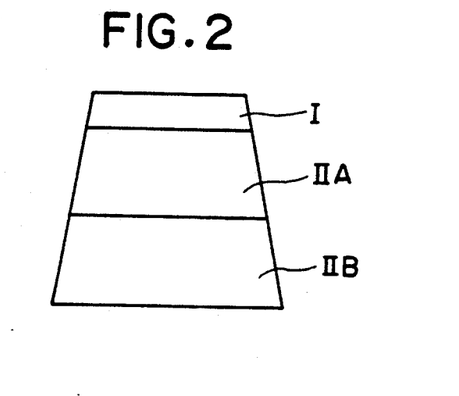
FIG. 2 shows a schematic side view of the relief portion of the second embodiment of photo resin relief printing plate according to the present invention.

Referring to FIG. 2 in which a schematic side view of the relief portion of a second embodiment of photoresin relief printing plate according to the present invention is shown, the photoresin relief portion comprises upper photoresin layer I and first lower photoresin layer IIA and second lower photoresin layer IIB. The photoresin relief portion is disposed on a support (not shown). Upper photoresin layer I is required to have a thickness of at least 2 µm and a Young's modulus of not greater than 650 kg/cm², preferably not greater than 300 kg/cm². If the thickness of upper photoresin layer I is less than 2 µm or the Young's modulus of upper photoresin layer I is larger than 650 kg/cm², a good ink adhesion to the relief cannot be attained, leading to a lowering of ink transferability with respect to solid images.

In the second embodiment, the lower photoresin layer of the relief portion comprises first lower photoresin layer IIA disposed on the side of upper photoresin layer I and second lower photoresin layer IIB disposed on the side of the support. The total thickness of layers I, IIA and IIB is not larger than 8 mm. First lower photoresin layer IIA (hereinafter often referred to as "first hard layer") has a Young's modulus different from that of second lower photoresin layer IIB. First lower photoresin layer has a thickness of at least 0.1 mm and a Young's modulus of at least 2 times that of upper photoresin layer I. Second hard layer IIB has a thickness of at least 0.05 mm, preferably at least 0.2 mm. The total thickness of first and second lower photoresin layers IIA and IIB is at least 4 times, preferably at least 8 times that of upper photoresin layer I. Second lower photoresin layer (hereinafter often referred to as the "second hard layer") has a Young's modulus of at least that of upper photoresin layer I, preferably at least 2 times that of upper photoresin layer I.

In the second embodiment of the present invention, the relationships in thickness and Young's modulus between layer I, layer IIA and layer IIB can be schematically represented as follows:

| Thickness |
|---|
| I + IIA + IIB ≦ 8 mm |
| I ≧ 2 µm |
| IIA ≧ 0.1 mm |
| IIB ≧ 0.05 mm, preferably IIB ≧ 0.2 mm |
| IIA + IIB ≧ 4 × I, preferably IIA + IIB ≧ 8 × I |
| Young's modulus |

$I \leq 650 \text{ kg/cm}^2$, preferably $I \leq 300 \text{ kg/cm}^2$
$IIA \geq 2 \times I$
$IIB \geq I$, preferably $IIB \leq 2 \times I$
$IIA \neq IIB$ With respect to the second embodiment, particularly when the Young's modulus of second hard layer IIB is smaller than the Young's modulus of first hard layer IIA, the printing pressure applied to upper photoresin layer I constituting the printing image portion of the printing plate and applied to first hard layer IIA is absorbed by second hard layer IIB due to the cushioning action thereof, so that excellent printing properties, such as excellent image reproducibility can be obtained without non-uniformity in printed images.

Figure 3:
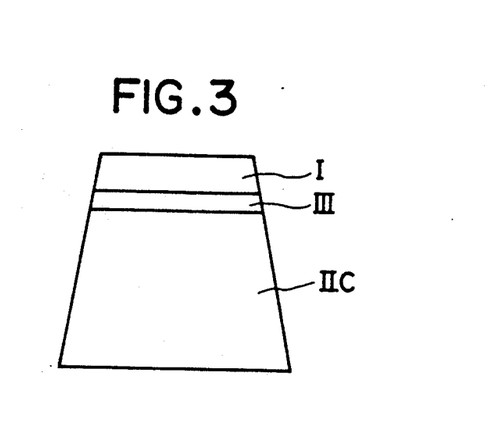
FIG. 3 shows a schematic side view of the relief portion of the third embodiment of photoresin relief printing plate according to the present invention.

Referring to FIG. 3 in which a schematic side view of the relief portion of a third embodiment of photoresin relief printing plate according to the present invention is shown, the photoresin relief portion comprises upper photoresin layer I, lower photoresin layer IIC and intermediate layer III disposed therebetween. The photoresin relief portion is disposed on a support (not shown).

Upper photoresin layer I is required to have a thickness of at least 2 μm and a Young's modulus of not greater than 650 kg/cm², preferably not greater than 300 kg/cm². If the thickness of upper photoresin layer I is less than 2 μm or the Young's modulus of upper photoresin layer I is larger than 650 kg/cm², a good ink adhesion to the relief cannot be attained, leading to a lowering of ink transferability with respect to solid images. The total thickness of upper photoresin layer I, intermediate layer III and lower photoresin layer IIC is not greater than 8 mm.

As described above, the relief portion has intermediate layer III between upper photoresin layer I and lower photoresin layer IIC. Intermediate layer III has a thickness of at least 0.2 μm but smaller than 0.1 mm and, preferably at least 2 μm but smaller than 0.1 mm. The thickness of lower photoresin layer IIC is at least 4 times, preferably at least 8 times that of the total thickness of upper photoresin layer I and intermediate layer III. Lower photoresin layer IIC has a Young's modulus of at least 2 times the Young's modulus of upper photoresin layer I. The Young's modulus of the intermediate layer is not limited but preferably not greater than the Young's modulus of lower photoresin layer IIC. Intermediate layer III is effective to enhance the peeling resistance between upper photoresin layer I and lower photoresin layer IIC.

In the third embodiment of the present invention, the relationships in thickness and Young's modulus between layer I, layer IIC and layer III can be schematically represented as follows:

Thickness
$I + IIC + III \leq 8 \text{ mm}$
$I \geq 2 \text{ μm}$
$IIC \geq 4(I + III)$, preferably $IIC \geq 8(I + III)$
$0.1 \text{ mm} > III \geq 0.2 \text{ μm}$, preferably $0.1 \text{ mm} > III \geq 2 \text{ μm}$ Young's modulus
$I \leq 650 \text{ kg/cm}^2$, preferably $I \leq 300 \text{ kg/cm}^2$
$IIC \geq 2 \times I$
III is not limited, preferably $III \leq IIC$ In the present invention, the relief of the photoresin relief printing plate may be formed directly on the support. Alternatively, the relief may be indirectly formed on the support through a photoresin back layer having a uniform thickness which is formed on the support. The above-mentioned photoresin back layer formed on the support may be formed simultaneously with or separately from the relief. Further, the above-mentioned photoresin back layer is regarded as a part of lower photoresin layer II, IIB or IIC, and is preferably formed from a resin which is identical with the resin constituting lower photoresin layer II, IIB or IIC.

The multilayer relief of the photoresin relief printing plate of the present invention may preferably be prepared using two or three different types of liquid photosensitive resins. Alternatively, two or three types of solid photosensitive resins can also be employed.

As examples of liquid photosensitive resins, there may be mentioned liquid photosensitive resin compositions comprising an unsaturated polyester, an addition-polymerizable ethylenically unsaturated monomer, a photopolymerization initiator and a thermal polymerization inhibitor.

Examples of unsaturated polyesters include those which can be obtained by the polycondensation reaction between an alcohol component containing at least one polyol, an acid component comprising at least one unsaturated polybasic acid or a derivative thereof (e.g., an acid anhydride, a methyl or ethyl ester or an acid halide) and, optionally, a saturated polybasic acid.

Examples of unsaturated polybasic acids include maleic acid, fumaric acid, citraconic acid, mesaconic acid, itaconic acid, glutaconic acid, muconic acid and aconitic acid.

Examples of saturated polybasic acids include oxalic acid, malonic acid, succinic acid, glutaric acid, adipic acid, pimelic acid, suberic acid, azelaic acid, sebacic acid, phthalic acid, isophthalic acid, terephthalic acid and pyromellitic acid.

Examples of polyols include ethylene glycol, 1,2-propylene glycol, 1,3-propanediol, 1,4-butanediol, diethylene glycol, dipropylene glycol, polyethylene glycol (having a number average molecular weight of 150 or more), polypropylene glycol (having a number average molecular weight of 192 or more), polybutylene glycol (having a number average molecular weight of 162 or more), poly(oxyethyleneoxypropylene) glycol (having a number average molecular weight of 120 or more), glycerin, erythritol, pentaerythritol, hexitol and trimethylolpropane.

Examples of addition-polymerizable ethylenically unsaturated monomers include acrylic acid, methacrylic acid and esters thereof [e.g., methyl (meth)acrylate, ethyl (meth)acrylate, n-propyl (meth)acrylate, isopropyl (meth)acrylate, n-hexyl (meth)acrylate, n-octyl (meth)acrylate, n-dodecyl (meth)acrylate, cyclohexyl (meth)acrylate, tetrahydrofurfuryl (meth)acrylate, allyl (meth)acrylate, glycidyl (meth)acrylate, 2-hydroxyethyl (meth)acrylate, 2-hydroxypropyl (meth)acrylate, 3-chloro-2-hydroxy (meth)acrylate, or 4-hydroxybutyl (meth)acrylate; mono- or diacrylates or methacrylates of ethylene glycol, diethylene glycol, propylene glycol, dipropylene glycol, polyethylene glycol, polypropylene glycol or butylene glycol; trimethylolpropane triacrylate or trimethacrylate, pentaerythritol tetracrylate or tetramethacrylate], acrylamide, methacrylamide, and derivatives thereof (e.g., N-methylolacrylamide or methacrylamide, N-methoxyacrylamide or methacrylamide, N,N'-methylenebisacrylamide or methacrylamide, N,N'-hexamethylenebisacrylamide or methacrylamide, diacetoneacrylamide or methacrylamide), styrene, vinyltoluene, divinylbenzene, diallyl phthalate, triallyl cyanurate or vinyl acetate.

Examples of photopolymerization initiators include benzoin, benzoin methyl ether, benzoin ethyl ester, benzoin n-propyl ether, benzoin isopropyl ether, benzoin n-butyl ether, benzoin isobutyl ether, benzoin sec-butyl ether, α-methylbenzoin, α-ethylbenzoin, α-methylbenzoin methyl ether, α-chloroanthraquinone, methylanthraquinone, ethylanthraquinone, benzil, diacetyl, acetophenone, benzophenone, ω-bromoacetophenone, 2-naphthalenesulphonyl chloride, diphenyldisulphide and various dyes [e.g., Eosine G (C.I. 45380) or Thionine (C.I. 52025)].

Examples of thermal polymerization inhibitors include hydroquinone, p-methoxyphenol, catechol, tert-butylhydroquinone, benzoquinone, p-phenylenediamine, picric acid or phenothiazine.

As another liquid photosensitive resin composition, there can be mentioned a photosensitive composition comprising a polymer obtained by reacting a prepolymer containing at least two terminal isocyanate groups with an addition-polymerizable ethylenically unsaturated monomer containing a hydroxyl group; an addition-polymerizable ethylenically unsaturated monomer, a photopolymerization initiator; and a thermal polymerization inhibitor. Such polymers are described in U.S. Pat. No. 3,960,572 and Japanese Patent Application The prepolymer to be employed in the above-mentioned composition can be obtained by reacting a polyol compound having two or more terminal hydroxyl groups with a polyisocyanate having at least two isocyanate groups. As the polyol compounds, those having a relatively high molecular weight (200 to 5,000) are preferred; for example, there can be used polyether-polyols, polyesterpolyols or polyalkylenepolyols. As the polyisocyanates, there can be used, for example, toluylene diisocyanate, xylylene diisocyanate or hexamethylene diisocyanate. In this reaction, various products are obtained according to the reaction conditions, for example, the molar ratio of the polyol to the polyisocyanate, reaction order, etc. The reaction is conducted in a manner such that the resultant prepolymer contains at least two terminal isocyanate groups.

As examples of addition-polymerizable ethylenically unsaturated monomers containing a hydroxyl group to be reacted with the above-mentioned prepolymer, there can be mentioned, 2-hydroxyethyl methacrylate, 2-hydroxyethyl acrylate, 2-hydroxypropyl methacrylate, N-hydroxymethylacrylamide, polyethylene glycol monomethacrylate, allyl alcohol and hydroxystyrene.

As the addition-polymerizable ethylenically unsaturated monomer, photopolymerization initiator and thermal polymerization inhibitor to be used for this composition, those described hereinbefore can be used.

As still another liquid photosensitive resin, there can be mentioned a photosensitive resin composition comprising a polyene containing at least two carbon-carbon unsaturated bonds per molecule, a polythiol containing two or more thiol groups per molecule, and a photosensitizer such as benzophenone (see, for example, U.K. Patent No. 1251 232 and Japanese Patent Application Publication No. 46-29525).

A predetermined Young's modulus for the photocured resin derived from a liquid photosensitive resin can easily be obtained according to conventional methods. For example, in the case of the liquid photosensitive resin comprising an unsaturated polyester, an addition-polymerizable ethylenically unsaturated monomer, a photopolymerization initiator and a thermal polymerization inhibitor, a predetermined Young's modulus can be obtained by adjusting the molar ratio of the unsaturated polybasic acid to the saturated polybasic acid in the unsaturated polyester, the molar ratio of the addition-polymerizable ethylenically unsaturated monomer to the unsaturated polyester, or the molar ratio of the bi-functional or poly-functional monomer to the addition-polymerizable ethylenically unsaturated monomers. These adjusting methods can be employed individually or in combination.

As mentioned above, a predetermined Young's modulus can easily be obtained, for example, by adjusting the ratio of the unsaturated polybasic acid to the saturated polybasic acid in the unsaturated polyester so that the average molecular weight of the unsaturated polyester per mole of unsaturated group in the unsaturated polyester is adjusted. When the ratio is increased so that the average molecular weight of the unsaturated polyester per mole of the unsaturated group is reduced, a hard resin having a high Young's modulus can be obtained by photocuring the photosensitive resin having the reduced average molecular weight of the unsaturated polyester. On the other hand, when the ratio is reduced, a soft resin having a low Young's modulus can be obtained. In this connection, however, it should be noted that even when the ratio is reduced in order to increase the average molecular weight of the unsaturated polyester per mole of the unsaturated group, the reduction of the ratio should be conducted in a manner such that at least one unsaturated group on average is present in each polyester molecule.

In general, when the molar ratio of the addition-polymerizable ethylenically unsaturated monomer having a low molecular weight per mole of unsaturated group to the unsaturated polyester is increased, a hard resin can be obtained. Monomers having two (bifunctional) or more (polyfunctional) unsaturated groups per molecule are particularly effective for obtaining a hard resin.

Using the above-mentioned methods, the Young's modulus of a photoresin can easily be adjusted, since there is a positive correlation between the concentration of photopolymerizable unsaturated groups in a photosensitive resin composition and the Young's modulus of a photoresin obtained by curing the photosensitive resin composition.

When a liquid photosensitive resin comprising a polymer obtained by reacting a prepolymer having at least two terminal isocyanate groups with an addition-polymerizable ethylenically unsaturated monomer containing a hydroxyl group; an addition-polymerizable ethylenically unsaturated monomer; a photopolymerizable initiator and a thermal polymerization inhibitor is employed, the Young's modulus may be adjusted by adjusting the molecular weight of the prepolymer, the molar ratio of the polymer to the addition-polymerizable ethylenically unsaturated monomer, or the molar ratio of the bi-functional or poly-functional monomer to the addition-polymerizable ethylenically unsaturated monomers. These adjusting methods can be employed individually or in combination. As the molecular weight of the prepolymer increases, a softer resin can be obtained. When a polyol having relatively low molecular weight is used for the preparation of the prepolymer, a hard resin can be obtained irrespective of the molecular weight of the resulting prepolymer.

When a liquid photosensitive resin comprising a polyene containing at least two carbon-carbon unsaturated bonds per molecule, a polythiol containing two or more thiol groups per molecule and a sensitizer is used, a predetermined Young's modulus of the photocured resin can be obtained by adjusting the number of carbon-carbon unsaturated bonds in the polyene per molecule or the number of thiol groups in the polythiol per molecule. These adjusting methods can be employed individually or in combination. For example, analogous to the adjustments described above for the Young's modulus of the polyester, as the average molecular weight of the polyene per mole of unsaturated bond increases, a lower Young's modulus is obtained, whereas as the average molecular weight decreases, a polymer having a higher Young's modulus, i.e., and a harder polymer is obtained. As the polythiol, esters of thiol-containing organic acid [such as thioglycolic acid ($HSCH_2COOH$) and α-mercaptopropionic acid ($HSCH(CH_3)$—$COOH$)] and polyols having 2 or more —OH groups are preferably used. When a low molecular weight polyol, such as ethylene glycol, glycerin or pentaerithrytol is used, a relatively hard resin can be obtained, whereas when a high molecular weight polyol, such as polypropylene glycol, is used, a relatively soft resin can be obtained.

With respect to the combined use of different liquid photosensitive resins for producing the photoresin relief printing plate of the present invention, there is no particular limitation with respect to the types thereof and any combination of resins can optionally be chosen from the above-described compositions as long as the above-mentioned requirements for the specific Young's modulus relationships between the soft and hard layers of the photoresin relief are satisfied. Not only the above mentioned photosensitive resin compositions but also any conventional photosensitive resin compositions can be used provided that the Young's modulus requirements are satisfied. From the view point of the desired adhesiveness between the photocured resin layers after plate-making and from the standpoint of ease in removal of the unexposed resin after image-forming exposure using a common developer, it is preferable to choose two or three liquid photosensitive resins from among those of the same type, without being limited to this choice. The term "same type" means that the main components of the compositions are those belonging to the same category of chemical structure (for example, unsaturated polyester type, unsaturated polyurethane type or polyene type).

In the case where the relief of the photoresin relief printing plate of the present invention is prepared from two or three solid photosensitive resin layers, solid photosensitive resins can be selected from conventional solid photosensitive compositions having rubber elasticity which are usually employed for preparing flexographic printing plates. Examples of solid photosensitive compositions include a composition comprising a thermoplastic elastomer, an ethylenically unsaturated compound and a photopolymerization initiator (see, for example, Japanese Patent Application Publication No. 51-43374); and compositions disclosed in Japanese Patent Application Laid-Open Specification Nos. 49-102405, 50-63091, and 49-102406 and Japanese Patent Application Publication Nos. 50-6034 and 49-18721. A predetermined Young's modulus of the photoresin to be prepared from a solid photosensitive resin by photocuring can be obtained by adjusting the proportions of the components in the photosensitive resin by the adjusting methods as described above.

As the support to be used in the present invention, there may be mentioned, for example, metal plates made of iron, stainless steel, copper, zinc or aluminum; rubber sheets made of natural or synthetic rubber; and plastic sheets or films made of celluloid, cellulose acetate, polyethylene, polypropylene, polyvinyl chloride, polymethyl methacrylate, polystyrene, polycarbonate, polyethylene terephthalate or polyamides. The support generally has a thickness of 0.025 to 0.50 mm. In general, an anti-halation layer and an adhesive layer are preferably provided on the surface of the support before coating a photosensitive resin on the support.

In general, the photoresin relief printing plate of the present invention can be produced by applying to the surface of a support a liquid photosensitive resin for forming a hard layer, optionally a liquid photosensitive resin for forming an intermediate layer, and then a photosensitive resin for forming a soft layer in predetermined thicknesses, respectively; superposing an image-bearing transparency thereon; irradiating the resultant laminate assembly with active rays from the side of the image-bearing transparency to effect image wise exposure; and removing the unexposed, uncured resin from the photoresin layers to develop a relief image.

One method of providing a laminate comprising a support and two or three liquid photosensitive resin and support layers disposed thereon consists in coating a soft layer forming photosensitive resin, optionally an intermediate layer forming photosensitive resin, and then a hard layer forming photosensitive resin in this order in predetermined thicknesses over a transparent cover film intimately disposed on a negative film, using a brush, roll, doctor knife or the like, to form two or three liquid photosensitive resin layers, and then placing a support on the hard layer forming photosensitive resin. Alternatively, it is possible to coat two or three types of liquid photosensitive resins in the reverse order to the above-mentioned order on a support, using a brush, roll, doctor knife or the like, to form liquid photosensitive resin layers; and then superpose a negative film having a transparent cover film intimately deposed thereon in a manner such that the cover film contacts the soft layer forming photosensitive resin layer.

Examples of image-bearing transparencies include not only negative or positive films for use in making photographic plates, but also those prepared by image-wise masking the surface of a film or sheet substantially transparent to active rays, such as plastic film or sheet, glass sheet, cellophane paper, paper or the like, with a masking material capable of interrupting active rays.

Examples of active-rays sources include a low pressure mercury lamp, high pressure mercury lamp, super high pressure mercury lamp, ultraviolet ray fluorescent lamp, carbon arc lamp, xenon lamp and sunlight.

In producing a photoresin printing plate according to the present invention, imagewise exposure is conducted by irradiating the above-prepared laminate with active rays from the side of the soft layer forming photosensitive resin layer through the image-bearing transparency. When the support desposed on the hard layer forming photosensitive resin layer is substantially transparent to the active rays, it is possible, as described in U.S. Pat. Nos. 3,663,222 and 3,832,177, to irradiate the laminate with active rays from the support side to form, on the support, a back layer having a desired thickness which is useful for adjusting the height of relief. This back layer is regarded as a part of the relief.

There may be a difference between the thickness of a photosensitive resin layer and that of the photoresin layer produced therefrom by photocuring, but such a difference in thickness therebetween is as small as 1 to 3% and therefore can be ignored.

After irradiation with active rays through an image-bearing transparency, unexposed (uncured) resin is washed away, for example, by means of a washing liquid, such as water, alcohol, acetone, benzene, toluene, chloroethane, chloroethylene, an aqueous alkaline solution (for example, an aqueous solution of sodium hydroxide, sodium carbonate, sodium phosphate, sodium tripolyphosphate, sodium borate or sodium silicate) and an aqueous solution of a surfactant. A surface active agent or the like may optionally be added to an aqueous alkaline solution.

The photoresin relief printing plate of the present invention comprises a multilayer relief composed of a soft upper photoresin layer and a hard lower photoresin layer, wherein the lower photoresin layer has a thickness of greater than that of the upper photoresin layer and a Young's modulus of greater than that of the upper photoresin layer. The photoresin relief printing plate of the present invention exhibits not only excellent inking and ink transferability even with respect to solid images, but also substantial freedom from broadening of the lines constituting printed images and excellent image reproducibility, even if the printing operation is performed using an ordinary relief printing machine having poor machine accuracy.

Further, it is noted that when the hard lower photoresin layer of the printing relief is produced from a plurality of photosensitive resin compositions having different photosensitivity characteristics (even though the compositions are the same each other with respect to the Young's modulus of each of the photoresins produced therefrom), there can be obtained a photoresin relief printing plate having further improved printing characteristics, such as sharp printed-image producibility, high image reproducibility, high ink transferability, and the like.

The present invention will now be described in more detail with reference to the following Reference Examples, Examples and Comparative Examples, which should not be construed as limiting the scope of the present invention.

In the following Reference Examples, parts are by weight unless otherwise indicated.

In the following Reference Examples, the Young's moludus of a photoresin is determined by a method in which a stress-strain curve is prepared in accordance with JIS K 7113 with respect to a sample of a photoresin and the gradient as obtained by extending the initial linear portion of the stress-strain curve is divided by the sectional area of the sample. The above-mentioned sample is prepared by exposing a photosensitive resin plate having a thickness of 1 mm to active rays at an intensity of about 1.0 m W/cm² emitted from a chemical lamp (FL 20BL manufactured and sold by Toshiba Corporation, Japan) from both sides for 5 minutes for curing the plate.

Measurements of the vacant area ratio and the broadening of printed images are performed as follows:

A vacant area ratio (%) is measured with respect to a solid image which has been magnified under reflected light using a half tone dots analyzer (Areadac AD-1000 manufactured and sold by KONICA, Japan).

The broadening of a printed line is measured by determining the difference between the width of a relief line of a printing plate and that of the printed image corresponding to the relief line, using a magnifier having a scale magnified 100 times.

REFERENCE EXAMPLE 1

Propylene glycol, diethylene glycol, adipic acid, fumaric acid and isophthalic acid are mixed together in a molar ratio of 0.25/0.75/0.50/0.25/0.25, and to the resultant mixture are added 0.5% by weight of p-toluenesulfonic acid as an esterification catalyst and 0.2% by weight of hydroquinone as a thermal polymerization inhibitor, followed by condensation reaction at 180° C. for 3 hours in a nitrogen atmosphere under the atmospheric pressure. Thereafter, reaction is continued at 220° C. under a reduced pressure of 20 mmHg for 3 hours, thereby obtaining an unsaturated polyester having an acid value of 28.

To 100 parts of the above-obtained unsaturated polyester are added 35 parts of 2-hydroxyethyl methacrylate, 10 parts of N-3-oxo-1,1-dimethylbutyl acrylamide, 10 parts of tetraethylene glycol dimethacrylate, 2 parts of benzoin ethyl ether and 0.1 part of hydroquinone, thereby to obtain a photosensitive resin composition.

The above-obtained photosensitive resin composition is poured into a retaining mold made up of two glass plates and a 1 mm-thick spacer and subjected to irradiation at about 1.2 mW/cm² from both sides for 5 minutes using an ultraviolet fluorescent lamp (FL-20BL manufactured and sold by Toshiba Corporation, Japan), thereby obtaining a photoresin plate. The photoresin plate has a Young's modulus of 650 kg/cm².

REFERENCE EXAMPLE 2

To 100 parts of the unsaturated polyester obtained in Reference Example 1, there are added 20 parts of diethylene glycol dimethacrylate, 10 parts of tetraethylene glycol dimethacrylate, 10 parts of N-3-oxo-1,1-dimethylbutyl acrylamide, 20 parts of 2-hydroxyethyl methacrylate, 2.5 parts of benzoin ethyl ether and 0.1 part of hydroquinone, to obtain a photosensitive resin composition. When the resin composition is subjected to curing in the same manner as in Reference Example 1, the resultant photoresin plate has a Young's modulus of 2,800 kg/cm².

REFERENCE EXAMPLE 3

100 parts of polycaprolactone diol (number average molecular weight: 510), 20 parts of polypropylene glycol (number average molecular weight: 950), 50 parts of tolylene diisocyanate and 2,6-di-t-butyl-p-cresol are mixed together and subjected to reaction at 70° C. for 2 hours. To the resultant reaction mixture, 25 parts of 2-hydroxyethyl methacrylate and 0.1 part of hydroquinone are added, and further reaction is performed at 80° C. for 2 hours, to thereby obtain an unsaturated polyurethane.

To 100 parts of the above-obtained unsaturated polyurethane are added 35 parts of 2-hydroxypropyl methacrylate, 20 parts of diethylene glycol dimethacrylate, 1.5 parts of benzoin ethyl ether and 0.1 part of hydroquinone, to obtain a photosensitive resin composition. A photoresin plate obtained by curing the thus obtained resin composition in the same manner as in Reference Example 1 has a Young's modulus of 8,500 kg/cm².

REFERENCE EXAMPLE 4

100 parts of an ethylene oxide/propylene oxide block copolymer diol (ethylene oxide unit content: 35 wt %, number average molecular weight: 2,000), 100 parts of polyethylene adipate diol (number average molecular weight: 2,000), 21 parts of tolylene diisocyanate and 0.5 part of dibutyltin laurate are mixed and reaction is performed at 70° C. for 2 hours. To the resultant reaction mixture, 45 parts of 2-hydroxypropyl methacrylate and 0.1 part of hydroquinone are added, and further reaction is performed at 70° C. for 2 hours, thereby to obtain an unsaturated polyurethane.

To 100 parts of the above-obtained unsaturated polyurethane are added 10 parts of 2-hydroxypropyl methacrylate, 10 parts of diethylene glycol dimethacrylate, 10 parts of lauryl methacrylate, 1.5 parts of benzoin ethyl ether and 0.1 part of hydroquinone, to obtain a photosensitive resin composition. A photoresin plate obtained by curing the thus obtained resin composition in the same manner as in Reference Example 1 has a Young's modulus of 105 kg/cm$^2$.

REFERENCE EXAMPLE 5

100 parts of an ethylene oxide/propylene oxide block copolymer diol (ethylene oxide unit content: 35 wt %, number average molecular weight: 2,000), 100 parts of polyethylene adipate diol (number average molecular weight: 2,000), 13 parts of tolylene diisocyanate and 0.5 part of dibutyltin laurate are mixed and reaction is performed at 70° C. for 2 hours. To the resultant reaction mixture, 18 parts of 2-hydroxypropyl methacrylate and 0.05 part of hydroquinone are added, and further reaction is performed at 70° C. for 2 hours, thereby to obtain an unsaturated polyurethane.

To 100 parts of the above-obtained unsaturated polyurethane are added 10 parts of polypropylene glycol monomethacrylate (number average molecular weight: 380), 12 parts of lauryl methacrylate, 5 parts of diethylene glycol dimethacrylate, 1.5 parts of benzoin ethyl ether and 0.1 part of hydroquinone, to obtain a photosensitive resin composition. A photoresin plate obtained by curing the thus obtained resin composition in the same manner as in Reference Example 1 has a Young's modulus of 15 kg/cm$^2$.

REFERENCE EXAMPLE 6

To 100 parts of the unsaturated polyurethane obtained in Reference Example 5, there are added 13 parts of lauryl methacrylate, 15 parts of polypropylene glycol monomethacrylate (number average molecular weight: 380), 4 parts of diethylene glycol dimethacrylate, 1 part of benzoin ethyl ether and 0.1 part of hydroquinone, to obtain a photosensitive resin composition.

A photoresin plate obtained by curing the thus obtained resin composition in the same manner as in Reference Example 1 has a Young's modulus of 6.5 kg/cm$^2$.

REFERENCE EXAMPLE 7

To 100 parts of the unsaturated polyurethane obtained in Reference Example 5, there are added 15 parts of lauryl methacrylate, 15 parts of polypropylene glycol monomethacrylate (number average molecular weight: 380), 3 parts of tetraethylene glycol dimethacrylate, 1.5 parts of benzoin ethyl ether and 0.1 part of hydroquinone, to obtain a photosensitive resin composition.

A photoresin plate obtained by curing the thus obtained resin composition in the same manner as in Reference Example 1 has a Young's modulus of 3.0 kg/cm$^2$.

REFERENCE EXAMPLE 8

100 parts of water-soluble polyamide (AQ nylon P-70 manufactured and sold by Toray Industries, Inc., Japan), 3 parts of ethylene glycol, 100 parts of methanol, 5 parts of diethylene glycol dimethacrylate, 1 part of benzoin ethyl ether and 0.2 part of hydroquinone are mixed and stirred for 1 hour at room temperature, to thereby obtain a dope. The thus obtained dope is coated on a 22 μm-thick polypropylene film in a thickness of approximately 0.04 mm by means of a doctor knife and dried overnight at room temperature, thereby obtaining a polypropylene film having a 25 μm-thick coating film of water-soluble polyamide.

Separately, the above-mentioned dope is subjected to drying at 30° C. at 50 mmHg for 1 hour using a vacuum dryer. The resultant product is heated at 110° C. for 4 minutes, and subjected to deaeration at 0 to 100 kg/cm$^2$ several times and then pressed at 120 kg/cm$^2$ for 3 minutes, followed by cooling, thereby obtaining a 1 mm-thick sheet. This sheet is sandwiched between two polyester films each having a 9-μm thickness, to obtain a laminate assembly. This assembly is subjected to light exposure from both sides for 5 minutes using the same light source as used in Reference Example 1, to thereby obtain a photoresin plate. The thus obtained plate has a Young's modulus of 280 kg/cm$^2$.

EXAMPLE 1

An image-bearing transparency is placed on a horizontal glass plate and the image-bearing transparency is covered with a 9 μm-thick polyester film. Then, the photosensitive resin composition obtained in Reference Example 5 is coated on the polyester film in a thickness of 0.03 mm using a doctor knife. Further, the photosensitive resin composition obtained in Reference Example 3 is coated on the above-formed resin composition layer in a thickness of 0.5 mm using a doctor knife, and a 0.1 mm-thick polyester substrate sheet having, coated thereon, an adhesive layer containing an anti-halation agent is placed thereon so that the adhesive contacts the upper resin layer.

The resultant assembly is subjected to light exposure at an ultraviolet-ray intensity of 1.8 mW/cm$^2$ first from the side of the substrate for 25 seconds and then from the side of the image-bearing transparency for 5 minutes using an ultraviolet fluorescent lamp (FL-20BL manufactured and sold by Toshiba Corporation, Japan). Over the resultant photosensitive resin structure after image-wise exposure is sprayed an aqueous solution containing 1% sodium borate and a 1% surfactant at 40° C. with a jetting pressure of 1.5 kg/cm$^2$ for 1.5 minutes to wash away unexposed resin, followed by water washing. The photosensitive resin structure is immersed in a vat containing water and post exposure is performed from the side of the relief for 10 minutes using the above-mentioned light source. Then, the structure is dried at 50° C. for 10 minutes in warm air, thereby obtaining a two-layer photoresin relief printing plate having a thickness of 0.63 mm.

When printing is performed using the thus-prepared printing plate fitted on a relief printing press, sharp impressions are obtained exhibiting excellent ink transferability and less broadening of the image. With respect to the impressions, the vacant area ratio of solid images is 2.0% and the broadening of lines having a width of 60 μm is 45 μm.

COMPARATIVE EXAMPLE 1

Substantially the same procedure as in Example 1 is conducted except that, in place of the two-layer photoresin relief, a single-layer photoresin relief is formed, that is, a single photosensitive resin layer having a 0.5 mm-thickness is formed using the photosensitive resin composition obtained in Reference Example 5, thereby obtaining a single-layer photoresin relief printing plate having the same thickness as in Example 1.

When printing is performed using the thus-prepared printing plate fitted on a relief printing press, ink transferability is good, but the broadening of the image is disadvantageously great and, thus, sharp impressions are not obtained.

With respect to the impressions, the vacant area ratio of solid images is 2.1%, but the broadening of lines having a width of 60 μm is 120 μm. When the printing pressure is reduced, the broadening is 50 μm which is acceptable, but the vacant area ratio is as large as 7%.

Separately, substantially the same procedure as described above is repeated except that the photosensitive resin composition is changed to that obtained in Reference Example 3, thereby obtaining a relief printing plate.

When printing is performed using the thus-prepared printing plate fitted on a relief printing press, fine letters are sharply printed, but not only large letters but also the shadow areas of half-tone images are liable to become dim due to poor ink transferability. Thus, good impressions are not obtained. The vacant area ratio and the broadening of lines having a width of 60 μm are 12% and 50 μm, respectively.

When the printing pressure and the amount of the ink are increased, ink transferability for large letters is good, but the broadening of fine letters is markedly increased. Thus, impressions having a good balance of qualities are not obtained. The vacant are ratio and the broadening are 2% and 90 μm, respectively.

EXAMPLE 2

Substantially the same procedure as in Example 1 is repeated except that a multi-layer relief structure is changed, that is, the photosensitive resin composition obtained in Reference Example 6 is coated in thicknesses of 0.005 mm, 0.015 mm, 0.05 mm, 0.10 mm and 0.25 mm individually, and then the resin composition obtained in Reference Example 2 is coated thereon in thicknesses such that all the ultimate relief printing plates equally have a thickness of 0.60 mm, thereby obtaining relief printing plates.

When printing is performed using each of the thus-prepared printing plates fitted on a relief printing press, the printing plates produce sharp impressions with excellent ink transferability and less broadening of the image, except for the printing plate employing the 0.25 mm-thick soft layer constituted by the photosensitive resin composition of Reference Example 6. The values of broadening of lines having a width of 60 μm at a printing pressure such that a vacant area ratio of 2.0% is produced, are shown in the following Table.

TABLE

| Thickness of the soft layer | Broadening | Quality of impressions |
|---|---|---|
| 0.005 mm | 50 μm | good |
| 0.015 mm | 40 μm | good |
| 0.05 mm | 50 μm | good |
| 0.10 mm | 60 μm | good |
| 0.25 mm | 90 μm | poor |

EXAMPLE 3

An image-bearing transparency is placed on a horizontal glass plate and the image-bearing transparency is covered with a 22 μm-thick polypropylene film. Then, the photosensitive resin composition obtained in Reference Example 7 is coated on the polypropylene film in a thickness of 0.8 mm using a doctor knife. Further, the photosensitive resin composition obtained in Reference Example 6 is coated on the above-coated resin composition in a thickness of 5.0 mm using a doctor knife, and a 0.1 mm-thick polyester substrate sheet having an adhesive layer coated thereon is then placed.

The resultant assembly is subjected to light exposure first from the side of the substrate for 85 seconds and then from the side of the image-bearing transparency for 10 minutes using the same light source as used in Example 1. Over the resultant photosensitive resin structure is sprayed a 2% aqueous solution of a surfactant (Lipon F manufactured and sold by The Lion Co., Ltd., Japan) at 40° C. with a jetting pressure of 1.5 kg/cm² for 3 minutes to wash away unexposed resin, followed by water washing. The photosensitive resin structure is immersed in a vat containing water and post exposure is performed from the side of the relief for 15 minutes using the above-mentioned light source. Then, the structure is dried at 50° C. for 10 minutes in warm air, thereby obtaining a photoresin relief printing plate having a thickness of 5.95 mm.

When printing on a corrugated board is performed using the thus-prepared printing plate fitted on a flexographic press, sharp impressions are produced with excellent ink transferability for solid images including large letters and less broadening for small letters. In the impressions, the vacant area ratio of solid images is 1.5% and the broadening of lines having a width of 300 μm is 180 μm.

COMPARATIVE EXAMPLE 2

Substantially the same procedure as in Example 3 is repeated except that only a single photosensitive resin layer having a 5.8 mm-thickness is formed using the photosensitive resin composition obtained in Reference Example 6, thereby obtaining a single-layer relief printing plate having a thickness of 5.95 mm.

In printing a corrugated board by means of the thus-prepared printing plate fitted on a flexographic press, although good ink transferability is obtained by increasing the printing pressure, the broadening of small letters is disadvantageously great and, thus, sharp impressions are not obtained.

In the impressions, the vacant area ratio of solid images is 2%, but the broadening of lines having a width of 300 μm is as large as 300 μm. When the printing pressure is reduced, the broadening is reduced to from 180 to 200 μm, but the vacant area ratio is as large as from 5 to 6%.

EXAMPLE 4

An image-bearing transparency is placed on a horizontal glass plate and the image-bearing transparency is covered with a 22 μm-thick polypropylene film. Then, the photosensitive resin composition obtained in Reference Example 4 is coated on the polypropylene film in a thickness of 0.05 mm using a doctor knife. Further, the photosensitive resin composition obtained in Reference Example 2 is coated on the above-formed resin composition layer in a thickness of 0.10 mm using a doctor knife, and then the photosensitive resin composition obtained in Reference Example 1 is coated thereon in a thickness of 0.7 mm using a doctor knife. Then, a 0.11 mm-thick polyester substrate sheet having an adhesive layer coated thereon is placed.

The resultant assembly is subjected to light exposure from the side of the substrate for 15 seconds using the same light source as employed in Example 1 and then from the side of the image-bearing transparency for 40 seconds using a water-cooled super-high pressure mercury lamp (Model CHM-3000 manufactured and sold by ORC Manufacturing Co., Ltd., Japan) having an irradiated-surface ultraviolet intensity of 11 mW/cm$^2$ as measured by UV-M01 (filter: UV-35) (manufactured and sold by ORC Manufacturing Co., Ltd., Japan). Over the resultant photosensitive resin structure is sprayed an aqueous solution containing 1% sodium borate and a 1% surfactant (Lipon F manufacture and sold by Lion Co., Ltd., Japan) at 40° C. with a jetting pressure of 1.5 kg/cm$^2$ for 2 minutes to wash away unexposed resin, followed by water washing. The photosensitive resin structure is immersed in a vat containing water and post exposure is performed from the side of the relief for 10 minutes using the same light source as employed in Example 1. Then, the structure is dried at 50° C. for 10 minutes in warm air, thereby obtaining a photoresin relief printing plate.

When printing is performed using the thus-prepared printing plate fitted on a relief printing press, sharp impressions are produced with excellent ink transferability and less broadening of the image.

COMPARATIVE EXAMPLE 3

Substantially the same procedure as in Example 4 is repeated except that, the photosensitive resin composition obtained in Reference Example 2 is coated in a thickness of 0.15 mm and then the photosensitive resin composition obtained in Reference Example 1 is coated in a thickness of 0.7 mm, thereby obtaining a relief printing plate.

When printing is performed using the thus-prepared printing plate fitted on the same relief printing press as used in Example 4, the broadening of the image is small and the sharpness of the image is good, but ink transferability is poor and solid images are dim. When the printing pressure is increased, the broadening of the images become large. Thus, there cannot be obtained impressions which are satisfactory in both ink transferability and image reproducibility.

EXAMPLE 5

An image-bearing transparency is placed on a horizontal glass plate and the image-bearing transparency is covered with a 22 μm-thick polypropylene film. Then, the photosensitive resin composition obtained in Reference Example 6 is coated on the polypropylene film in a thickness of 0.05 mm using a doctor knife. Further, the photosensitive resin composition obtained in Reference Example 1 is coated on the above-coated resin composition in a thickness of 0.35 mm using a doctor knife, and then the photosensitive resin composition obtained in Reference Example 6 is coated in a thickness of 0.35 mm using a doctor knife. Then, an about 0.1 mm-thick polyester substrate sheet having coated thereon an adhesive layer containing an anti-halation agent is placed.

The resultant assembly is subjected to light exposure from the side of the substrate for 30 seconds and then from the side of the transparency for 4 minutes using the same light source as employed in Example 1. Then, washing-out of unexposed resin, post exposure and drying are conducted in the same manner as in Example 3, thereby obtaining a photoresin relief printing plate A.

Substantially the same procedure as described above is repeated except that the photosensitive resin composition obtained in Reference Example 6 is first coated in a thickness of 0.05 mm, and then the photosensitive resin composition obtained in Reference Example 1 is coated in a thickness of 0.15 mm and further the photosensitive resin composition obtained in Reference Example 6 is coated in a thickness of 0.30 mm, thereby obtaining a photoresin relief printing plate B.

When printing is performed using each of the thus-prepared printing plates A and B individually fitted on a relief printing press, sharp impressions are produced with excellent ink transferability and less broadening of the image.

COMPARATIVE EXAMPLE 4

Substantially the same procedure as in Example 5 is repeated except that only a single photosensitive resin layer having a 0.5 mm-thickness is formed using the photosensitive resin composition obtained in Reference Example 6, thereby obtaining a relief printing plate having the same thickness as in Example 5.

In printing by means of the thus-prepared printing plate fitted on a relief printing press, a good ink transferability is attained by increasing the printing pressure, but the broadening of the image is caused to be great and, thus, sharp impressions are not obtained.

EXAMPLE 6

An image-bearing transparency is placed on a horizontal glass plate and a polypropylene film having coated thereon a 25 μm-thick layer of water-soluble polyamide obtained in Reference Example 8 is laminated on the glass plate using a rubber roll in a manner such that the coated surface of the polypropylene film is upward.

Then, the photosensitive resin composition obtained in Reference Example 3 is coated on the polyamide layer in a thickness of about 0.4 mm using a doctor knife, and an about 0.1 mm-thick polyester substrate sheet having coated thereon an adhesive layer containing an anti-halation agent is then placed.

The resultant assembly is subjected to light exposure first from the side of the substrate for 25 seconds and then from the side of the image-bearing transparency for 5 minutes using the same light source as employed in Example 1. Over the resultant photosensitive resin structure is sprayed an aqueous solution containing 1% sodium borate and a 1% surfactant at 35° C. with a jetting pressure of 1.0 kg/cm$^2$ for 60 seconds to wash away unexposed resin, followed by washing by spraying water. The photosensitive resin structure is subjected to post exposure in air for 5 minutes using the above-mentioned light source, thereby obtaining a photoresin relief printing plate having a thickness of 0.51 mm.

When printing is performed using the thus-prepared printing plate fitted on a relief printing press, sharp impressions are produced with excellent ink transferability in large letters and less broadening of small letters.

COMPARATIVE EXAMPLE 5

Substantially the same procedure as in Example 6 is repeated except that there is employed a 22 μm-thick polypropylene film which is not coated with the water-soluble polyamide, thereby obtaining a relief printing plate having the same thickness as in Example 6.

When printing is performed using the thus-prepared printing plate fitted on a relief printing press, ink transferability is poor and solid images including large letters are dim and, thus, good impressions are not obtained.

EXAMPLE 7

An image-bearing transparency is placed on a horizontal glass plate and the image-bearing transparency is covered with a 22 μm-thick polypropylene film. Then, the photosensitive resin composition obtained in Reference Example 5 is coated on the polypropylene film in a thickness of 0.05 mm using a doctor knife. Further, the photosensitive resin composition obtained in Reference Example 6 is coated on the above-coated resin composition in a thickness of 0.02 mm using a doctor knife, and then the photosensitive resin composition obtained in Reference Example 4 is coated in a thickness of 0.8 mm. Then, an about 0.1 mm-thick polyester substrate sheet having an adhesive layer coated thereon is placed.

The resultant assembly is subjected to light exposure first from the side of the substrate for 20 seconds and then from the side of the image-bearing transparency for 2.5 minutes using the same light source as used in Example 1. Over the resultant photosensitive resin structure is sprayed a 2% aqueous solution of a surfactant (Lipon F manufactured and sold by The Lion Co., Ltd., Japan) at 40° C. with a jetting pressure of 1.5 kg/cm² for 3 minutes to wash away unexposed resin, followed by water washing. The photosensitive resin structure is immersed in a vat containing water and post exposure is performed from the side of the relief for 10 minutes using the above-mentioned light source. Then, the structure is dried at 50° C. for 10 minutes in warm air, thereby obtaining a photoresin relief printing plate having a thickness of 1.00 mm.

When printing is performed using the thus-prepared printing plate fitted on a relief printing press, sharp impressions are produced with good ink transferability for solid images including large letters and less broadening of small letters.

What is claimed is:

1. A photoresin relief printing plate comprising:
  a support and a photoresin relief portion disposed thereon,
  said relief portion having a thickness of not greater than 8 mm and comprising an upper photoresin layer and a lower photoresin layer, said upper and lower photoresin layers being provided, on said support in the order from said support, of said lower photoresin layer and said upper photoresin layer,
  said upper photoresin layer having a thickness of at least 2 μm and a Young's modulus of not greater than 650 kg/cm²,
  said lower photoresin layer having a thickness which is at least 4 times the thickness of said upper photoresin layer and being composed of a single layer or two different layers, wherein said single layer of said lower photoresin layer has a Young's modulus which is greater than the Young's modulus of said upper photoresin layer, and said two different layers of said lower photoresin layer has an average Young's modulus which is greater than the Young's modulus of said upper photoresin layer.

2. The relief printing plate according to claim 1, wherein said lower photoresin layer is composed of a single layer and a Young's modulus of at least 2 times the Young's modulus of said upper photoresin layer.

3. The relief printing plate according to claim 1, wherein said lower photoresin layer comprises a first lower photoresin layer disposed on the side of said upper photoresin layer and a second lower photoresin layer disposed on the side of said support, said first lower photoresin layer having a Young's modulus which is different from the Young's modulus of said second lower photoresin layer, said first lower photoresin layer having a thickness of at least 0.1 mm and a Young's modulus of at least 2 times the Young's modulus of said upper photoresin layer, the total thickness of said first and second lower photoresin layers being at least 4 times the thickness of said upper photoresin layer, said second lower photoresin layer having a Young's modulus of not smaller than the Young's modulus of said upper photoresin layer.

4. The relief printing plate according to claim 1, having an intermediate layer between said upper photoresin layer and lower photoresin layer, said lower photoresin layer being composed of a single layer, wherein said intermediate layer has a thickness of at least 0.2 μm but smaller than 0.1 mm and wherein said lower photoresin layer has a thickness of at least 4 times the total thickness of said upper photoresin layer and said intermediate layer and has a Young's modulus of at least 2 times the Young's modulus of said upper photoresin layer.

5. The relief printing plate according to claims 1, 2, 3 or 4, wherein said upper photoresin layer has a Young's modulus of not greater than 300 kg/cm².

6. The relief printing plate according to claim 2, wherein said lower photoresin layer has a thickness of at least 8 times the thickness of said upper photoresin layer.

7. The relief printing plate according to claim 3, wherein said second lower photoresin layer has a Young's modulus photoresin layer.

8. The relief printing plate according to claim 3, wherein the total thickness of said first and second lower photoresin layers is at least 8 times the thickness of said upper photoresin layer.

9. The relief printing plate according to claim 4, wherein said intermediate layer has a thickness of at least 2 μm.

10. The relief printing plate according to claim 4, wherein the thickness of said lower photoresin layer is at least 8 times the total thickness of said upper photoresin layer and said intermediate layer.

* * * * *